US008843795B2

(12) United States Patent
Nakaya

(10) Patent No.: US 8,843,795 B2
(45) Date of Patent: Sep. 23, 2014

(54) TEST SYSTEM OF RECONFIGURABLE DEVICE AND ITS METHOD AND RECONFIGURABLE DEVICE FOR USE THEREIN

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 416 days.

(21) Appl. No.: 12/282,482

(22) PCT Filed: Mar. 1, 2007

(86) PCT No.: PCT/JP2007/053890
§ 371 (c)(1),
(2), (4) Date: Sep. 10, 2008

(87) PCT Pub. No.: WO2007/119300
PCT Pub. Date: Oct. 25, 2007

(65) Prior Publication Data
US 2009/0138770 A1    May 28, 2009

(30) Foreign Application Priority Data
Mar. 15, 2006  (JP) ................................. 2006-070118

(51) Int. Cl.
*G01R 31/28*       (2006.01)
*G01R 31/3185*     (2006.01)
(52) U.S. Cl.
CPC .............................. *G01R 31/318516* (2013.01)
USPC .......................................... 714/725; 714/727
(58) Field of Classification Search
CPC ................ G01R 31/318516; G01R 31/318533
USPC .................................................. 714/725–727
See application file for complete search history.

(56) References Cited

U.S. PATENT DOCUMENTS

| 5,448,525 | A  | * | 9/1995  | Sturges ........................... 365/201 |
| 5,550,843 | A  | * | 8/1996  | Yee ................................ 714/726 |
| 5,651,013 | A  | * | 7/1997  | Iadanza ........................... 714/731 |
| 5,764,079 | A  | * | 6/1998  | Patel et al. ...................... 326/40 |
| 6,070,252 | A  | * | 5/2000  | Xu et al. .......................... 714/30 |
| 6,924,663 | B2 | * | 8/2005  | Masui et al. ..................... 326/38 |
| 7,437,635 | B1 | * | 10/2008 | Dang et al. ..................... 714/726 |
| 7,500,162 | B2 | * | 3/2009  | Smith ............................ 714/725 |
| 7,620,864 | B2 | * | 11/2009 | Elliott ........................... 714/726 |
| 7,739,564 | B1 | * | 6/2010  | Lai et al. ........................ 714/725 |

FOREIGN PATENT DOCUMENTS

| JP | 4-278481    | A | 10/1992 |
| JP | 7-198784    | A | 8/1995  |
| JP | 9-178822    | A | 7/1997  |
| JP | 10-082839   | A | 3/1998  |
| JP | 11-44741    | A | 2/1999  |
| JP | 11-353357   | A | 12/1999 |
| JP | 2005-532756 | A | 10/2005 |
| JP | 2005-323399 | A | 11/2005 |

* cited by examiner

*Primary Examiner* — Steve Nguyen
(74) *Attorney, Agent, or Firm* — Sughrue Mion, PLLC

(57) ABSTRACT

A reconfigurable device test scheme is provided for making a test of a reconfigurable device with configuration data which is loaded a smaller number of times. A reconfigurable device used herein holds a plurality of configuration data and is capable of instantaneously switching which configuration is implemented thereby. Specifically, one transfer configuration data and one or more test configuration data are previously loaded in a configuration memory of the reconfigurable device, and a test is made while sequentially switching the transfer configuration data and the test configuration data. In this way, the same configuration data need not be reloaded over and over, so that the test can be made with a smaller number of times of loading as compared with before.

19 Claims, 19 Drawing Sheets

TEST SYSTEM OF RECONFIGURABLE DEVICE AND ITS METHOD AND RECONFIGURABLE DEVICE FOR USE THEREIN

TECHNICAL FIELD

The present invention relates to a system for and a method of testing a reconfigurable device, and a reconfigurable device for use therewith.

BACKGROUND ART

FIG. 1 shows exemplary blocks of an FPGA (Field Programmable Gate Array) which is a conventional reconfigurable device. The FPGA comprises logic block array 100, input/output blocks 30_y, 31_x, 32_y, 33_x responsible for data input/output outside the chip, peripheral blocks 50_y, 51_x, 52_y, 53_x which mediate both, and programmable wires (for example, 10_11, 10_21, 11_11, 11_12) for programmably connecting between these blocks. Logic block array 100 is a two-dimensional array of logic blocks 1_xy. Here, x, y are integers indicative of the position of each block.

FIG. 1 illustrates logic block array 100 which is comprised of logic blocks in five rows and five columns (i.e., x and y are integers from one to five, respectively), but in general, the size of a logic block array in an FPGA may be arbitrary.

One example of the logic block in FIG. 1 is shown in FIG. 2. Logic block 1 comprises input selectors 7A and 7B for selecting and outputting one signal from programmable wires 10_W and 12_S, functional element 3 for performing logical processing on outputs of input selectors 7A and 7B to output the result, register 4 for temporarily holding the output of functional element 3 in synchronization with a clock signal, programmable switch 5 for interconnecting the output of register 4 and for programmable wires 13_W, 13_E, 14_S, 14_N, and configuration memory 60.

Configuration memory 60 outputs a signal for determining signals selected from a plurality of input signals and output by input selector 7A and input selector 7B; a signal for determining a logical function of functional element 3; and a signal for determining inter-wire connections implemented by programmable switch 5.

Each logic block 1_xy in FIG. 1 has entirely the same structure of FIG. 2. Programmable wire 10_W in FIG. 2 is connected to an adjacent block to the left; programmable wire 10_E is connected to an adjacent block to the right; programmable wire 11-S is connected to an adjacent block below; and programmable wire 11_N is connected to an adjacent block above. Giving logic block 1_11 in FIG. 1 as an example, programmable wire 10_11 in FIG. 1 corresponds to programmable wire 10_W in FIG. 2; programmable wire 10_21 in FIG. 1 to programmable wire 10_E in FIG. 2; programmable wire 11_11 in FIG. 1 to programmable wire 11_S in FIG. 2; and programmable wire 11_12 in FIG. 1 to programmable wire 11_N in FIG. 2, respectively.

Bold arrows in FIG. 1 represent two signal paths 15 and 16 in a test configuration. On signal path 15, a signal is input from input/output block 30_4, and is supplied to all logic blocks through the programmable wires. On signal path 16, a signal is input from input/output block 30_3, and is supplied to all logic blocks through the programmable wires. The signals on both paths 15, 16 are supplied to each logic block, and simultaneously with this, are forwarded to left-hand adjacent blocks.

Bold arrows in FIG. 2 represent a signal path of each logic block 1 in the test configuration. Input selectors 7A, 7B are configured to output signals on paths 16, 15, respectively, while functional element 3 is configured to provide a logic function which should be tested. Further, programmable switch 5 is configured to convey signals on paths 15, 16 to programmable wire 13_E (i.e., forward them).

In the test configuration, by operating the FPGA by one clock, the result of processing signals on paths 15 16 by functional element 3 is preserved in register 4.

FIG. 3 is a diagram showing a transfer configuration of a test scheme of a conventional FPGA. Bold arrows represent signal path 18_y in the transfer configuration. Specifically, logic blocks in each row are connected from left to right in series, and the output of each row is output to input/output block 32_y through peripheral block 52_y.

Bold arrows in FIG. 4 represent a signal path of each logic block 1 in the transfer configuration. Input selector 7A is configured to output a signal on programmable wire 12_W, while functional element 3 is configured to output the output of input selector 7A as it is. Output 12_E of register 4 is connected to programmable wire 12_W of a left-hand adjacent logic block.

In FIG. 3, in the transfer configuration, registers 4 of the logic blocks on each row are sequentially connected from left to right in a one-to-another connection form. In this configuration, by operating the FPGA N-1 clocks, data in register 4 in each logic block is sequentially transferred to a left-hand adjacent block, and sequentially read out from the input/output block. Here, N is the number of logic blocks included in one row of logic block array 100.

FIG. 5 shows a flow chart of a conventional FPGA test scheme. At first step 500, a plurality of test configurations, test input data input from the input/output block in each test configuration, and one transfer configuration are prepared.

Next, a first test configuration is loaded into the FPGA (steps 505, 510), and the input/output block is applied with first test input data for the first test configuration (steps 515, 530). Next, the FPGA is operated one clock (step 540). In this way, the result of processing the test input data input from the input/output block by the functional element of the logic block, i.e., test result data, enters the registers in the logic blocks.

Next, the transfer configuration is loaded into the FPGA while the test result data is held in the registers (step 550). Next, the FPGA is operated N-1 clocks to read the test result data within the registers of all logic blocks from the input/output block. Simultaneously with the read, the test result data is compared with an expected value to check whether or not a failure exists (step 560). Next, second test input data of the first test configuration is applied to the input/output block (steps 575, 530).

Subsequently, until all test input data of the first test configuration are exhausted (decision 570), step 530 through step 575 are repeated. Next, a second test configuration is loaded into the FPGA (steps 585, 510). Subsequently, until all test configurations are exhausted (decision 580), steps 510 through 585 are repeated.

The conventional example described above is disclosed, for example, in JP-7-198784-A.

DISCLOSURE OF THE INVENTION

In such a conventional test scheme, test configuration data and transfer configuration data must be alternately and repeatedly loaded into the FPGA (steps 510 and 550), causing a problem in which the test time becomes long. In comparison with test input data comparable to a test vector of normal LSI, the FPGA involves more test and transfer configuration data which take longer to load. It is therefore desired to reduce the number of times the configuration data is loaded in order to reduce the test time.

It is an object of the present invention to provide a system for and a method of testing a reconfigurable device, which are capable of testing a reconfigurable device in which the number o times that the configurable data is loaded in reduced, and a reconfigurable device.

A test system according to the present invention is a system for testing a reconfigurable device including a plurality of programmable blocks, and programmable wires for programmably making a connection between these programmable blocks, characterized in that:

each of the programmable blocks comprises a configuration memory which previously stores test configuration data and transfer configuration data, and a register, and the system includes control means for reading the test configuration data from the configuration memories to set the programmable blocks in the test configuration state to make a test, and holding the test results in the registers in a test configuration, reading the transfer configuration data from the memory to connect the registers in series to sequentially read the test results in a transfer configuration, and alternately executing the test configuration state and the transfer configuration state.

A test method according to the present invention is a method of testing a reconfigurable device including a plurality of programmable blocks, and programmable wires for programmably making a connection between these programmable blocks, wherein:

each of the programmable blocks is provided with a configuration memory which previously stores test configuration data and transfer configuration data, and a register.

The method is characterized by comprising the steps of:

reading the test configuration data from the configuration memories to set the programmable blocks in the test configuration state to make a test, and holding the test results in the registers in a test configuration;

reading the transfer configuration data from the memory to connect the registers in series to sequentially read the test results in a transfer configuration; and alternately executing the test configuration state and the transfer configuration state.

A reconfigurable device according to the present invention is a reconfigurable device including a plurality of programmable blocks, and programmable wires for programmably making a connection between these programmable blocks, wherein:

each of the programmable blocks comprises a configuration memory which previously stores test configuration data and transfer configuration data, and a register, the reconfigurable device characterized by comprising control means for reading the test configuration data from the configuration memories to set the programmable blocks in the test configuration state to make a test, and holding the test results in the registers in a test configuration, reading the transfer configuration data from the memory to connect the registers in series to sequentially read the test results in a transfer configuration, and alternately executing the test configuration state and the transfer configuration state.

Effects of the present invention will be described. A reconfigurable device used herein holds a plurality of configuration data and is capable of instantaneously switching which configuration is implemented thereby. Specifically, one transfer configuration data and one or more test configuration data are previously loaded in the reconfigurable device, and a test is made while sequentially switching the transfer configuration data and the test configuration data. In this way, the same configuration data need not be reloaded a number of times, so that the test can be made in which the number of times that the data is loaded is reduced compared with previously.

According to the present invention, one or more test configuration data and one transfer configuration data are loaded in a memory of a reconfigurable device such that tests are performed using them again and again as appropriate, so that the test can be made with the advantage that the number of times that the data is loaded is reduced which consequently reduces the time needed for the tests.

Figure 1:
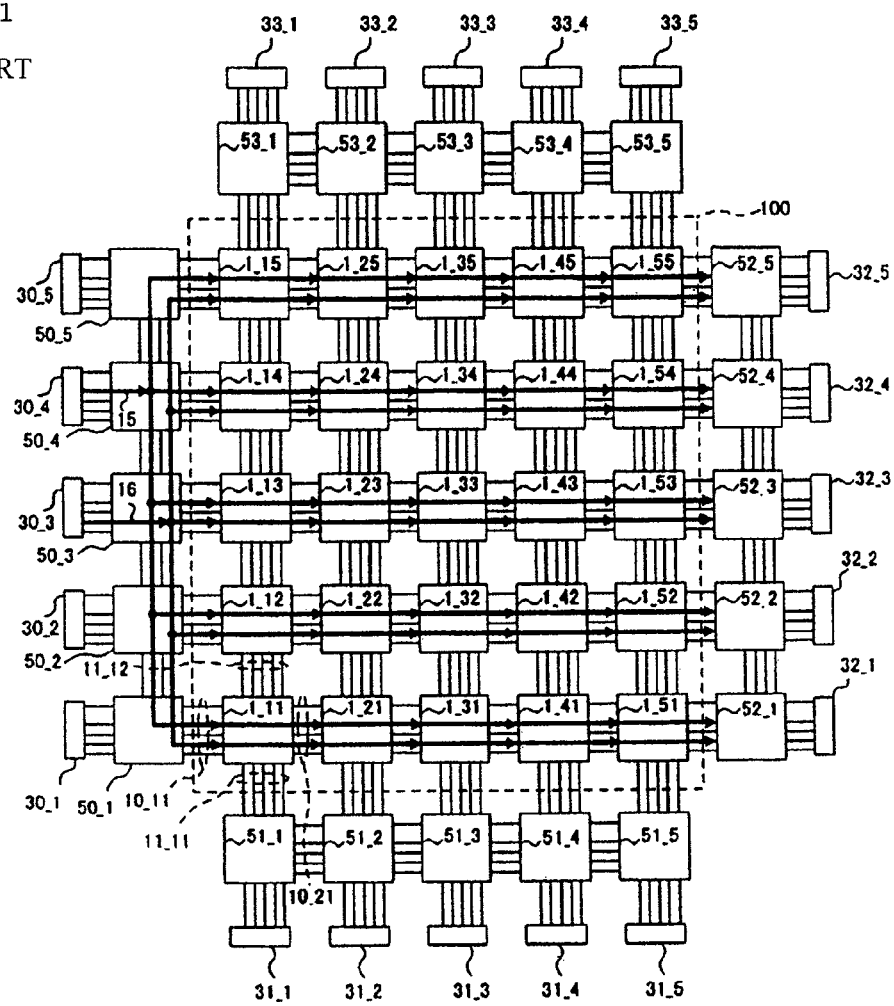
FIG. 1 is a diagram showing a test configuration in a conventional example.
Figure 2:
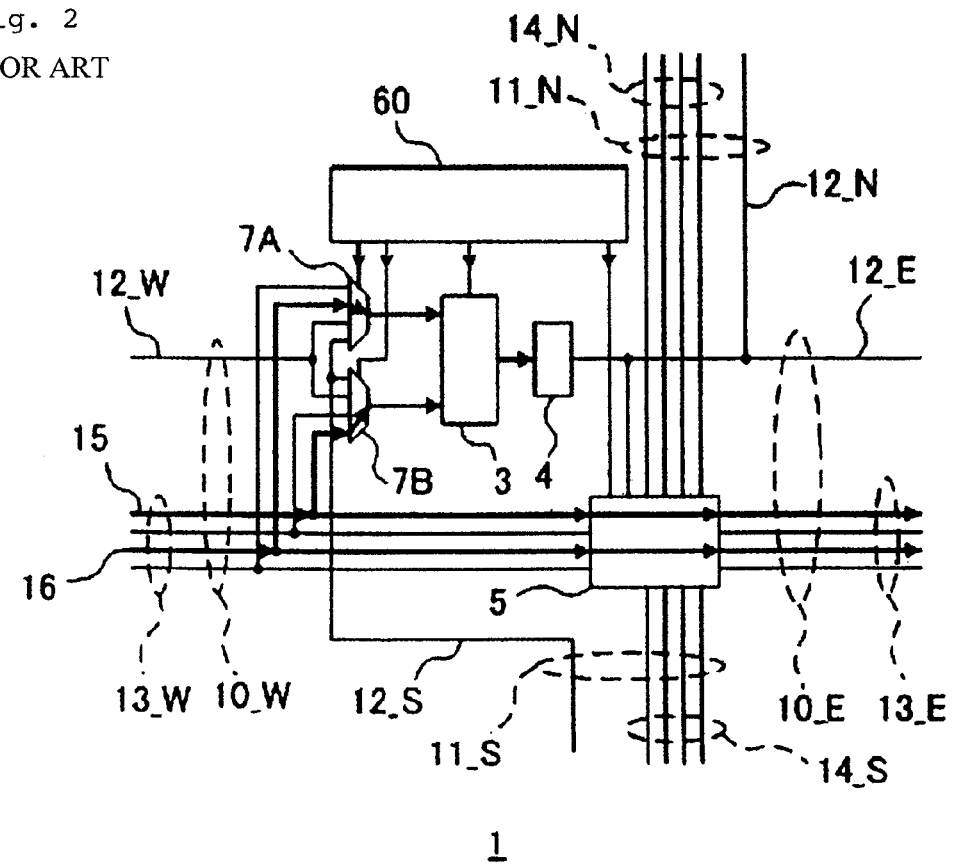
FIG. 2 is a diagram showing signal paths of logical blocks in the test configuration of the conventional example.
Figure 3:
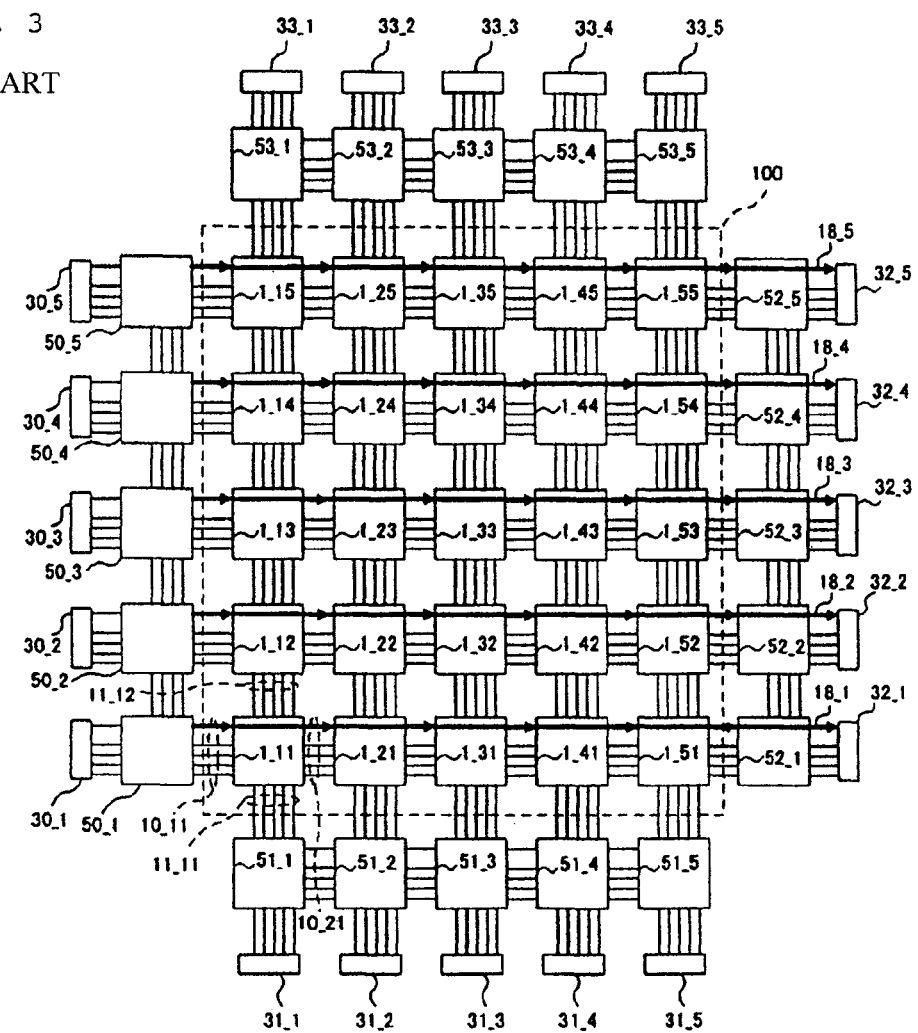
FIG. 3 is a diagram showing a transfer configuration in the conventional example.
Figure 4:
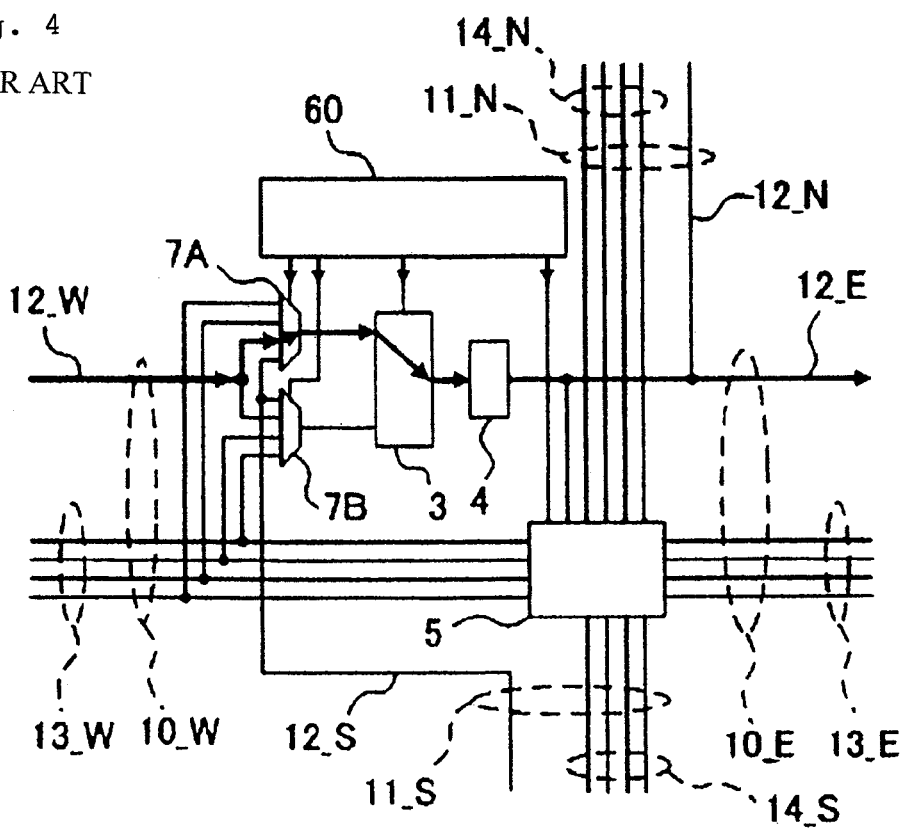
FIG. 4 is a diagram showing signal paths of logic blocks in the transfer configuration of the conventional example.
Figure 5:
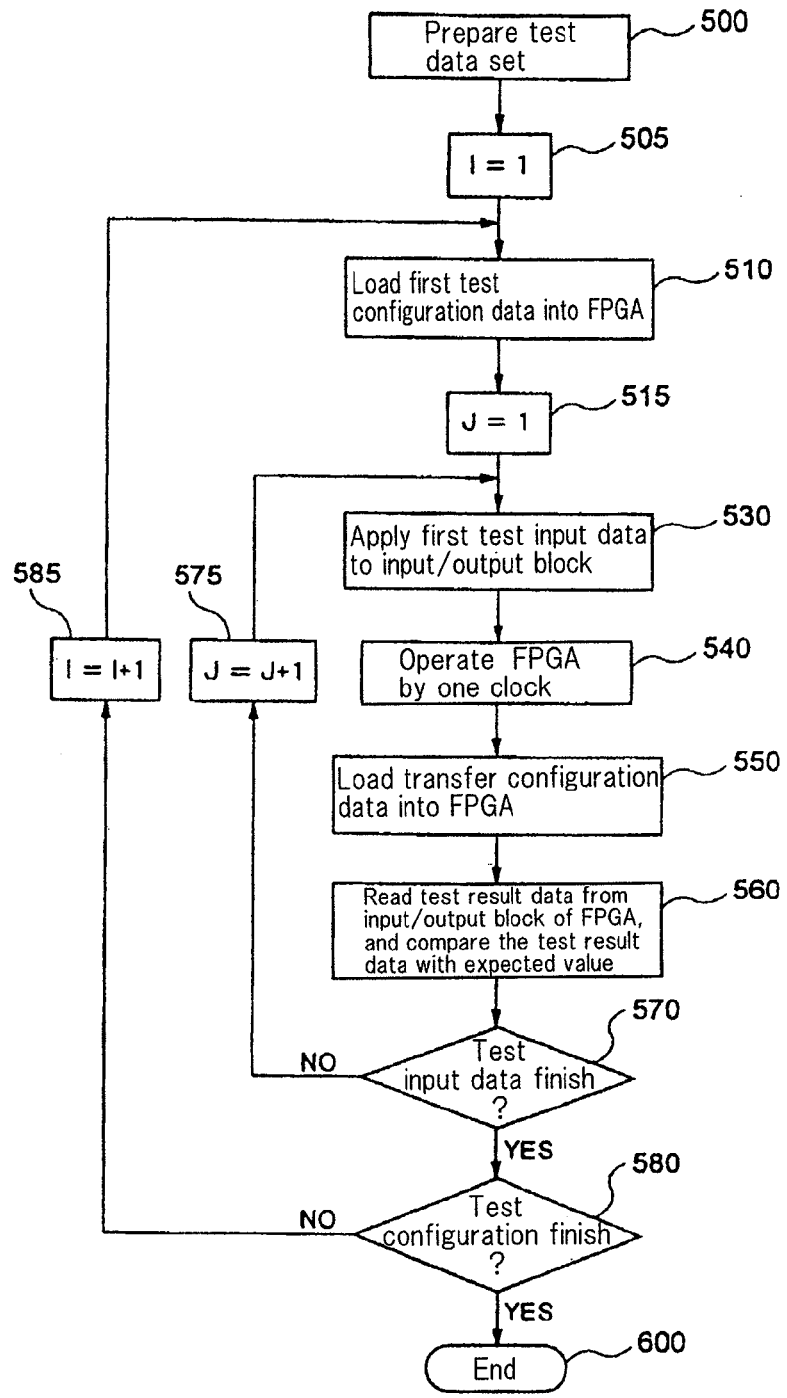
FIG. 5 is a flow chart of a test scheme in the conventional example.

DESCRIPTION OF REFERENCE NUMERALS 1, 1_xy Logic Blocks
3 Functional Element
4 Register
15, 16, 18_$i$ Signal Paths
17 Address Signal
5 Programmable Switch
7A, 7B Input Selectors
8 Data Memory
9 Comparator 20 Configuration Controller
24 Transition Address Generation Block
25 Transition Signal Generation Block
26 Configuration Address Selector
27 Transition Address Selector
30, 30_i, 31_i, 32_i, 33_i Input/Output Blocks
50, 50_i, 51_i, 52_i, 53_i Peripheral Blocks
60 Configuration Memory
70 Address Decoder
80 Configuration Address Unit
81 Transition Address Unit
90 Expected Value Comparator
96 Logical OR Gate
97 Logical AND Gate
100 Logic Block Array
200 Test Controller
210 Test Control Logic
211 Test Data Counter
212 Test Configuration Counter
213 Comparison Period Counter
310 Output Buffer
320 Input Buffer
340 Multiplexer
351, 352, 353, 354 Tri-state Buffers

BEST MODE FOR CARRYING OUT THE INVENTION

Figure 6:
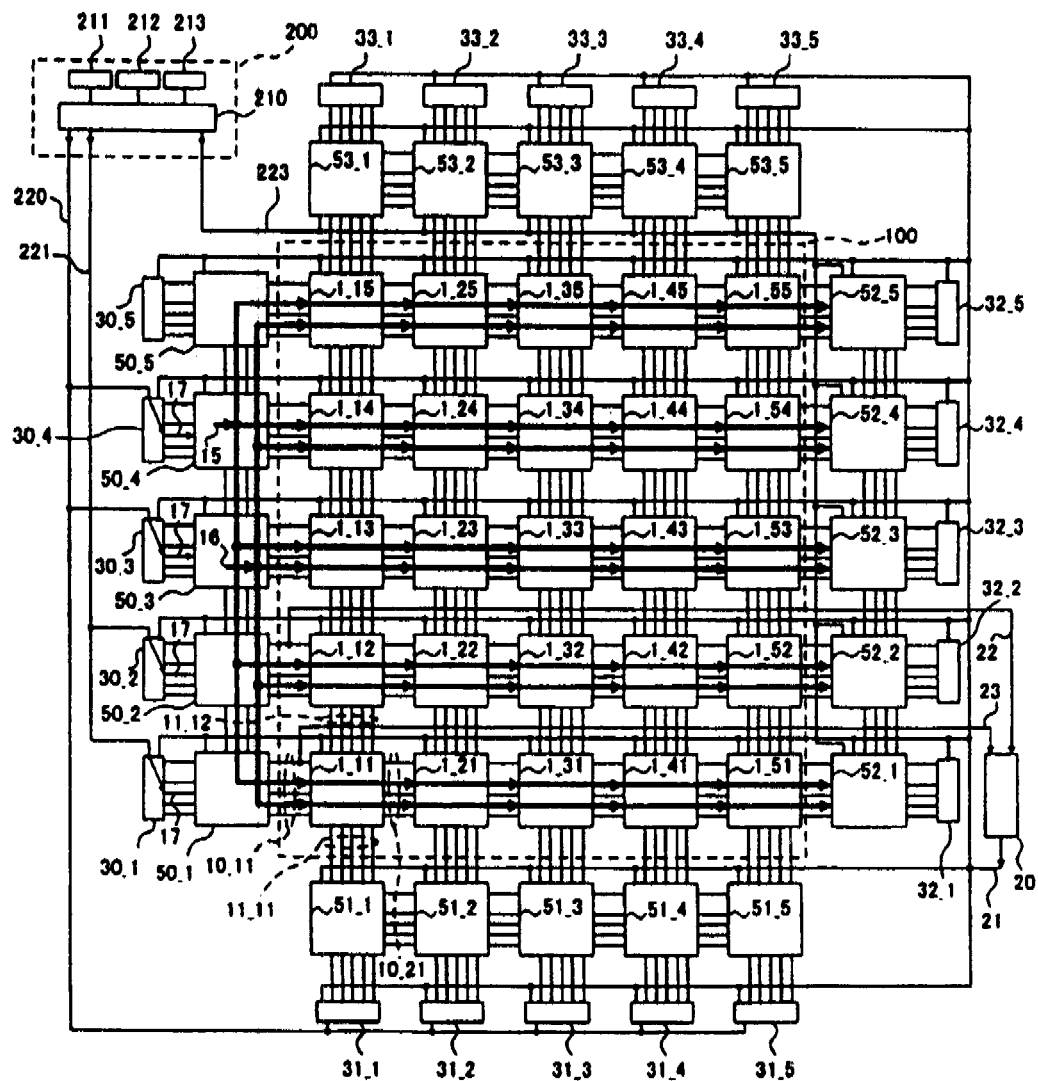
FIG. 6 is a diagram showing a test configuration in a first embodiment of the present invention.

In the following, referring to the drawings, embodiments of the present invention will be described in detail with reference to the drawings. FIG. 6 is a diagram showing a reconfigurable device and signal path in a test configuration in a first exemplary embodiment of the present invention.

Referring to FIG. 6, the reconfigurable device of the present invention comprises logic block array 100, input/output blocks 30_y, 31_x, 32_y, 33_x, peripheral blocks 50_y, 51_x, 52_y, 53_x, configuration controller 20, and test controller 200. Logic block array 100 is a two-dimensional array of logic blocks 1_xy. Here, x, y are integers indicative of the position of each block. FIG. 6 illustrates logic block array 100 comprised of logic blocks in five rows and five columns (i.e., x and y are integers from one to five, respectively), but in general, the size of the logic block array may be arbitrary. In the following, the logic blocks, peripheral blocks, and input/output blocks are collectively called the programmable blocks.

Each programmable logic in FIG. 6 is programmably connected to other programmable blocks, for example, through programmable wires labeled 10_11, 10_21, 11_11, 11_12. Configuration controller 20 supplies configuration address 21 to each programmable block.

Bold arrows in FIG. 6 represent two signal paths 15, 16 in a test configuration. On signal path 15, a signal is input from input/output block 50_4, and is supplied to all logic blocks through the programmable wires. On signal path 16, a signal is input from input/output block 50_3, and is supplied to all logic blocks through the programmable wires. Signals on these signal paths 15, 16 are supplied to each logic block, and simultaneously with this, are forwarded to left-hand adjacent blocks.

Figure 7:
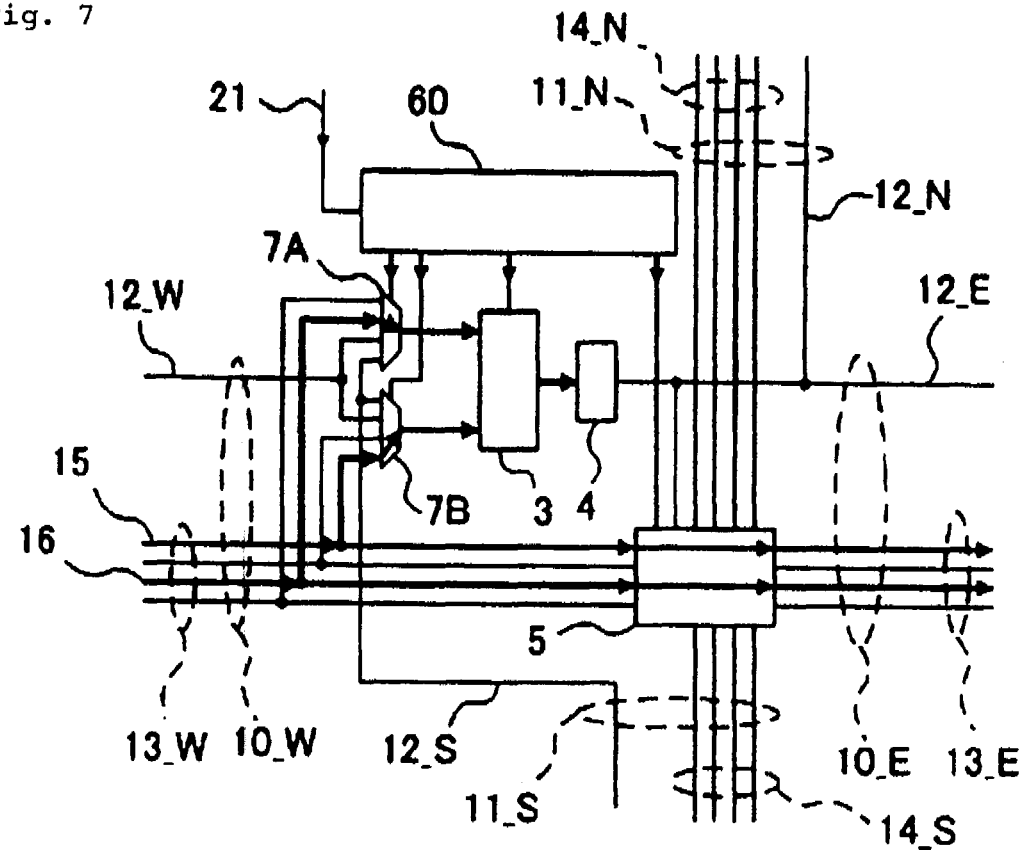
FIG. 7 is a diagram showing signal paths of logic blocks in the test configuration.

An example of the logic block in this embodiment is shown in FIG. 7. Logic block 1 comprises input selectors 7A and 7B for selecting and outputting one signal from programmable wires 10_W and 12_S, functional element 3 for performing logical processing on outputs of input selectors 7A and 7B to output the result, register 4 for temporarily holding the output of functional element 3 in synchronization with a clock signal, programmable switch 5 for making interconnections among the output of register 4 and programmable wires 13_W, 13_E, 14_S, 14_N, and configuration memory 60.

Configuration memory 60 outputs a signal for determining signals selected from a plurality of input signals and output by input selector 7A and input selector 7B; a signal for determining a logical function of functional element 3; and a signal for determining inter-wire connections implemented by programmable switch 5.

Each logic block 1_xy (x, y are integers) in FIG. 6 has entirely the same structure of FIG. 7. Programmable wire 10_W in FIG. 7 is connected to an adjacent block to the left; programmable wire 10_E is connected to an adjacent block to the right; programmable wire 11-S is connected to an adjacent block below; and programmable wire 11_N is connected to an adjacent block above. Giving logic block 1_11 in FIG. 6 as an example, programmable wire 10_11 in FIG. 6 corresponds to programmable wire 10_W in FIG. 7; programmable wire 10_21 in FIG. 6 to programmable wire 10_E in FIG. 7; programmable wire 11_11 in FIG. 6 to programmable wire 11_S in FIG. 7; and programmable wire 11_12 in FIG. 6 to programmable wire 11_N in FIG. 7, respectively.

Configuration memory 60 in FIG. 7 holds a plurality of configuration data, and outputs configuration data specified by configuration address 21 from among these configuration data.

Figure 8:
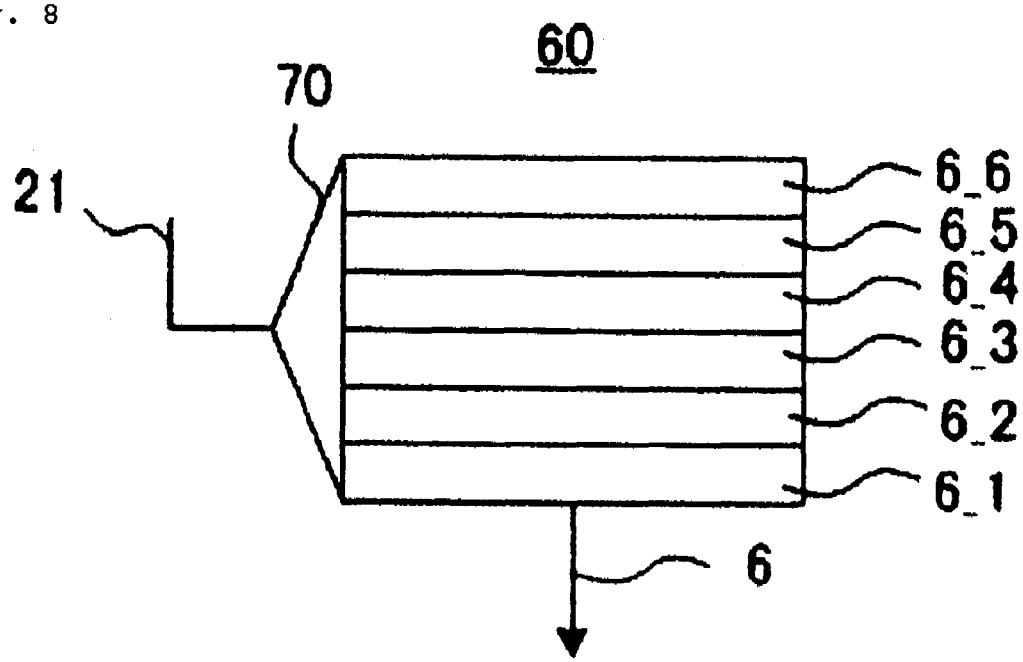
FIG. 8 is a diagram showing a configuration memory in the present invention.

FIG. 8 is an example of this configuration memory 60. Configuration memory 60 comprises a plurality of word data 6_x (x=1, 2, 3, ..., M) and address decoder 70. Here, M is the number of word data in the configuration memory, and while FIG. 8 shows an example of M=6, this may be any number.

Each word data corresponds to one configuration. In other words, configuration memory 60 can hold a plurality of configurations. Configuration address 21 is decoded by address decoder 70, and a word data, i.e., a configuration is selected by a decode signal and serves as output 6.

Bold arrows in FIG. 7 represent a signal path of each logic block 1 in the test configuration. Input selectors 7A, 7B are configured to output signals on paths 16, 15, respectively, while functional element 3 is configured to provide a logic function which should be tested. Further, programmable switch 5 is configured to forward signals on paths 15, 16 to programmable wire 13_E. Data for such a configuration is held in any one item of word data in FIG. 8 (for example, 6_1).

By outputting address data 21 corresponding to the configuration from configuration controller 20 in FIG. 6, the signal path represented by the bold arrows in FIG. 6 is implemented. In FIG. 6, test data address 220 output from test controller 200 becomes signal 17 through input/output blocks 30_3, 30_4, and is conveyed to peripheral blocks 50_3, 50_4.

Figure 9:
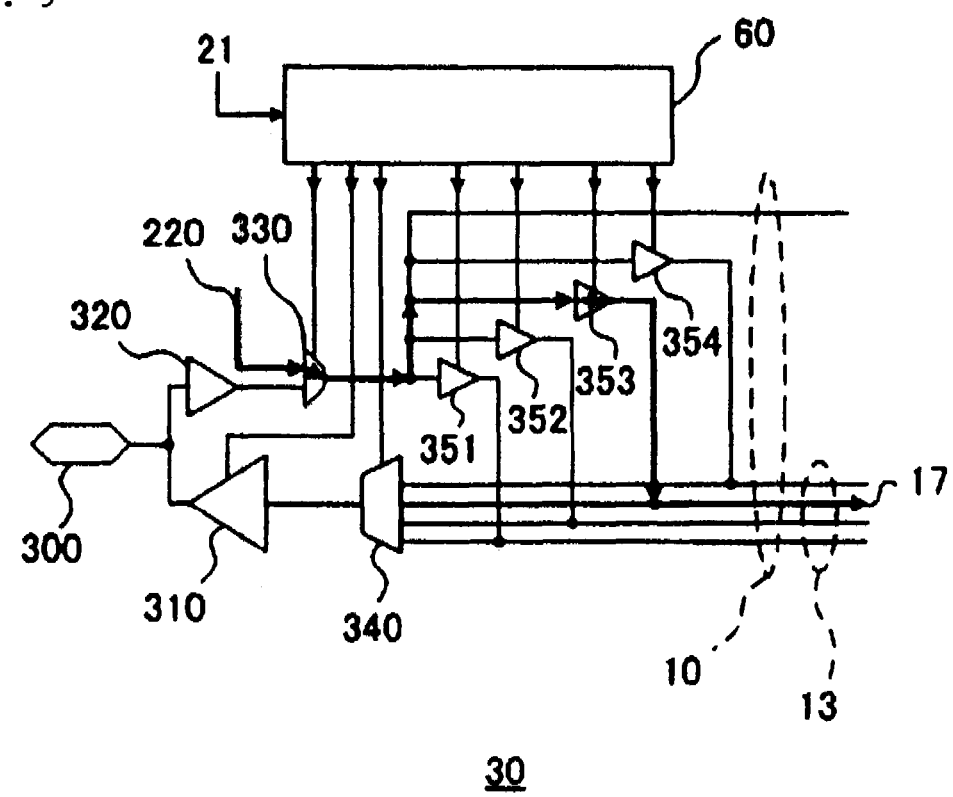
FIG. 9 is a diagram showing signal paths of input/output blocks in the test configuration.

An example of input/output block 30_y in FIG. 6 is shown in FIG. 9. input/output block 30 comprises input/output terminal 300, output buffer 310 for outputting a signal to input/output terminal 300, input buffer 320 for receiving a signal from input/output terminal 300, multiplexer 300 for selecting and outputting any one of the output of input buffer 320 and signal 220, tri-state buffers 351, 352, 353, 354 for selectively outputting the output of multiplexer 330 to programmable wires 13, multiplexer 340 for selecting any one of signals on programmable wires 13 and for applying the selected signal to output buffer 310 as an input, and configuration memory 60 for outputting configuration data which is addressed by configuration address 21.

The configuration data controls output buffer 310, tri-state buffers 351, 352, 353, 354 and multiplexers 330, 340. Programmable wires 10 are connected to adjacent peripheral blocks. Signal 220 in FIG. 9 correspond to test data address 220 in input/output blocks 30_4, 30_3 in FIG. 6, and to signal 221 in input/output blocks 30_1, 30_2, respectively.

In the test configuration, input/output blocks 30_4, 30_3 in FIG. 6 are configured to form a signal path as represented by bold arrows in FIG. 9. Specifically, multiplexer 330 outputs test data address 220, and tri-state buffer 353 is configured to output this output to the programmable wires such that it is conveyed to adjacent peripheral blocks as signal 17.

Figure 10:
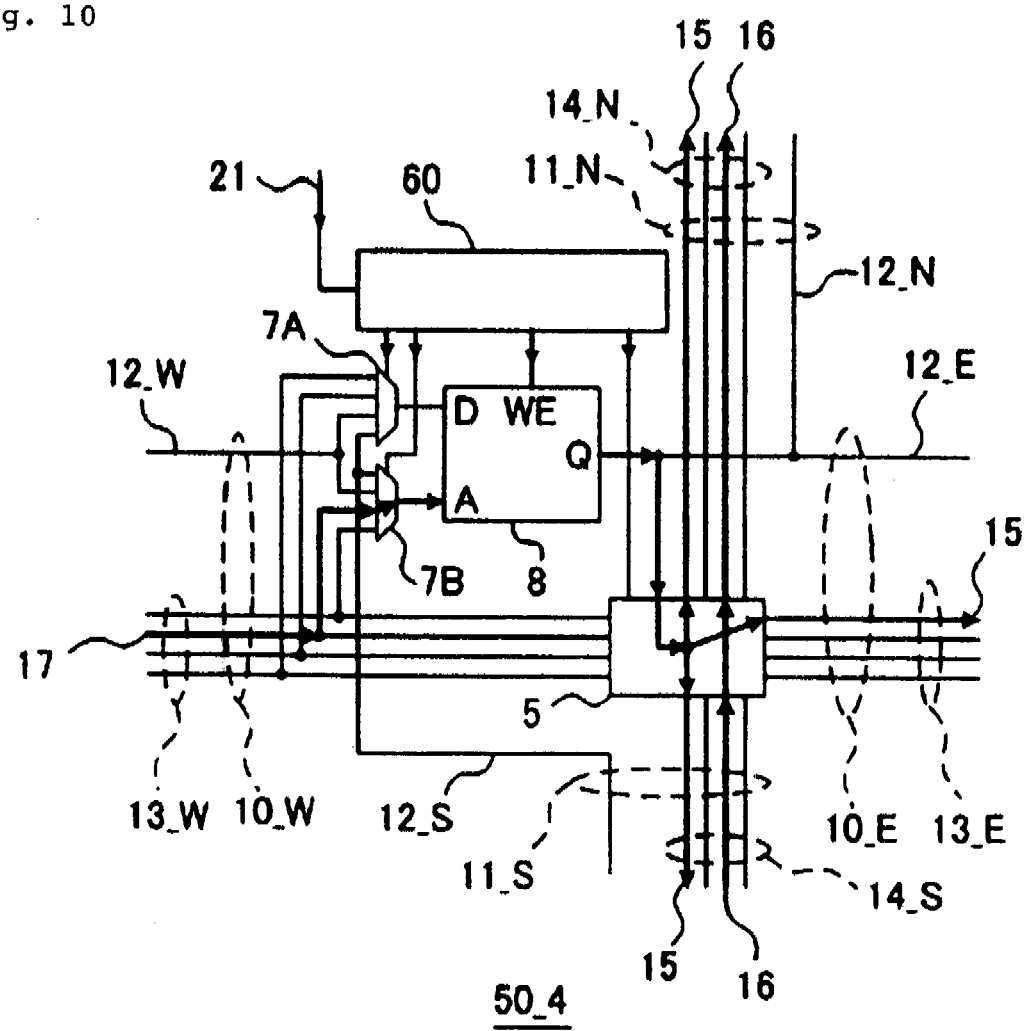
FIG. 10 is a diagram showing an example of signal paths of peripheral blocks in the test configuration.

An example of peripheral block 50_4 in FIG. 6 is shown in FIG. 10. Peripheral block 50_4 comprises input selectors 7A and 7B for selecting and outputting one signal from programmable wires 10_W and 12_S, data memory 8 supplied with the outputs of input selector 7A and input selector 7B to data input D and address A, respectively, programmable switch 5 for interconnecting output Q of data memory 8 with programmable wires 13_W, 13_E, 14_S, 14_N, and configuration memory 60.

Configuration memory 60 outputs a signal for determining signals selected from a plurality of input signals and output by input selector 7A and input selector 7B; a signal for determining whether or not the data memory is set to a write mode; and a signal for determining inter-wire connections implemented by programmable switch 5.

Other peripheral blocks 50_y in FIG. 6 are identical to FIG. 10 in structure. However, the configuration differs from one block to another. In the test configuration, peripheral block 50_4 in FIG. 6 is configured to form a signal path as represented by bold arrows in FIG. 10. Specifically, input selector 7B in FIG. 10 outputs signal 17 which is applied to address A of data memory 8, and programmable switch 5 is configured such that output Q of the data memory applies signal 15 to programmable wires 13_E, 14_S, and 14_N.

Further, programmable switch 5 is configured such that signal 16 supplied from peripheral block 50_3 through programmable wire 14_S is conveyed to programmable wire 14_N. Also, data memory 8 is configured to be in a read mode.

Figure 11:
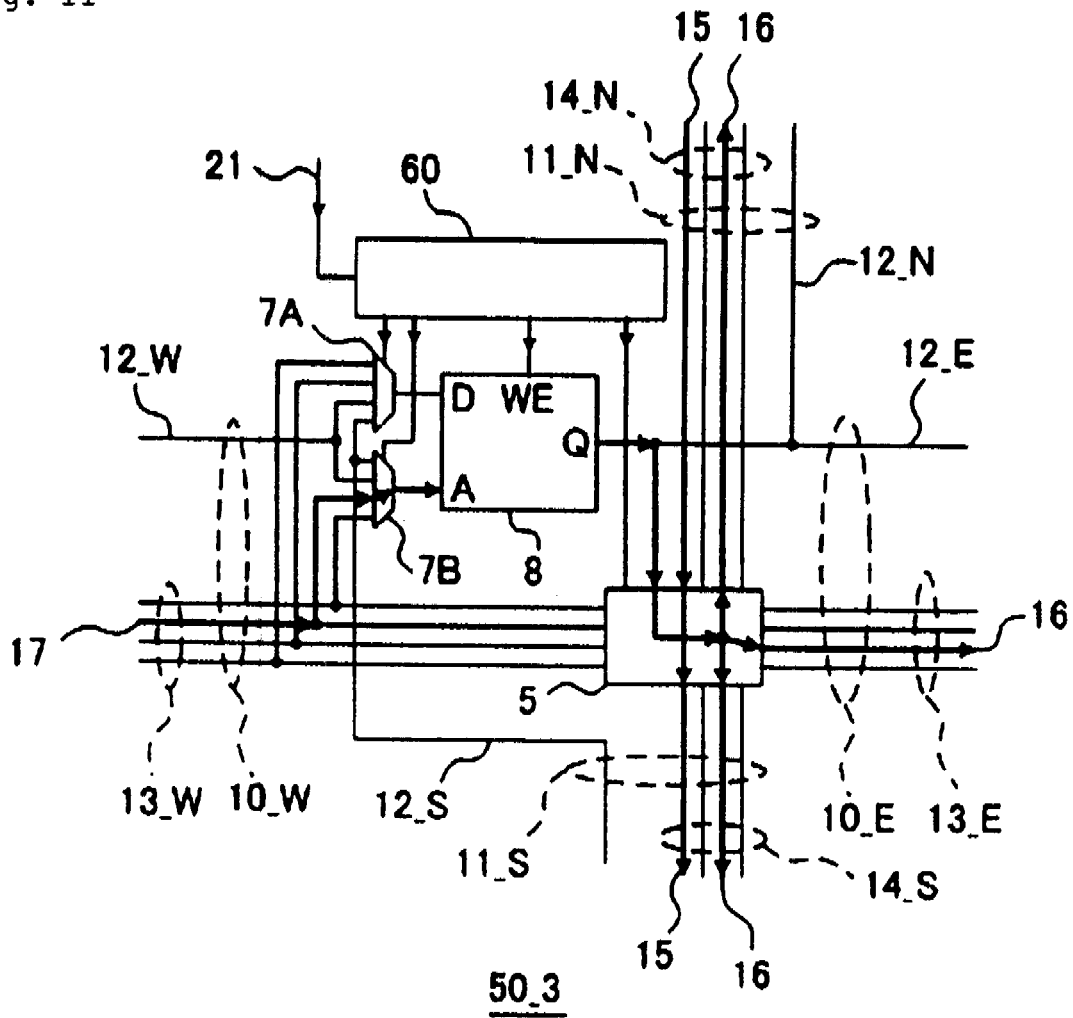
FIG. 11 is a diagram showing another example of signal paths of peripheral blocks in the test configuration.

FIG. 11 shows the configuration of peripheral block 50_3 in FIG. 6 (bold arrows). Programmable switch 5 is configured such that output Q of the data memory is conveyed to programmable wires 13_E, 14_S, 14_N as signal 16, and signal 15 supplied from peripheral block 50_4 through programmable wire 14_N is conveyed to programmable wire 14_S. The rest of the configuration is the same as peripheral block 50_4.

Peripheral blocks 50_y other than peripheral blocks 50_3, 50_4 are configured to convey signals 15, 16 as indicated by bold lines in FIG. 6. Data memories 8 in peripheral blocks 50_4, 50_3 hold test input data, and data addressed by test data address 220 in FIG. 6 is distributed to all logic blocks as signals 15, 16. Data in the data memory can be written as part of the configuration data.

Figure 12:
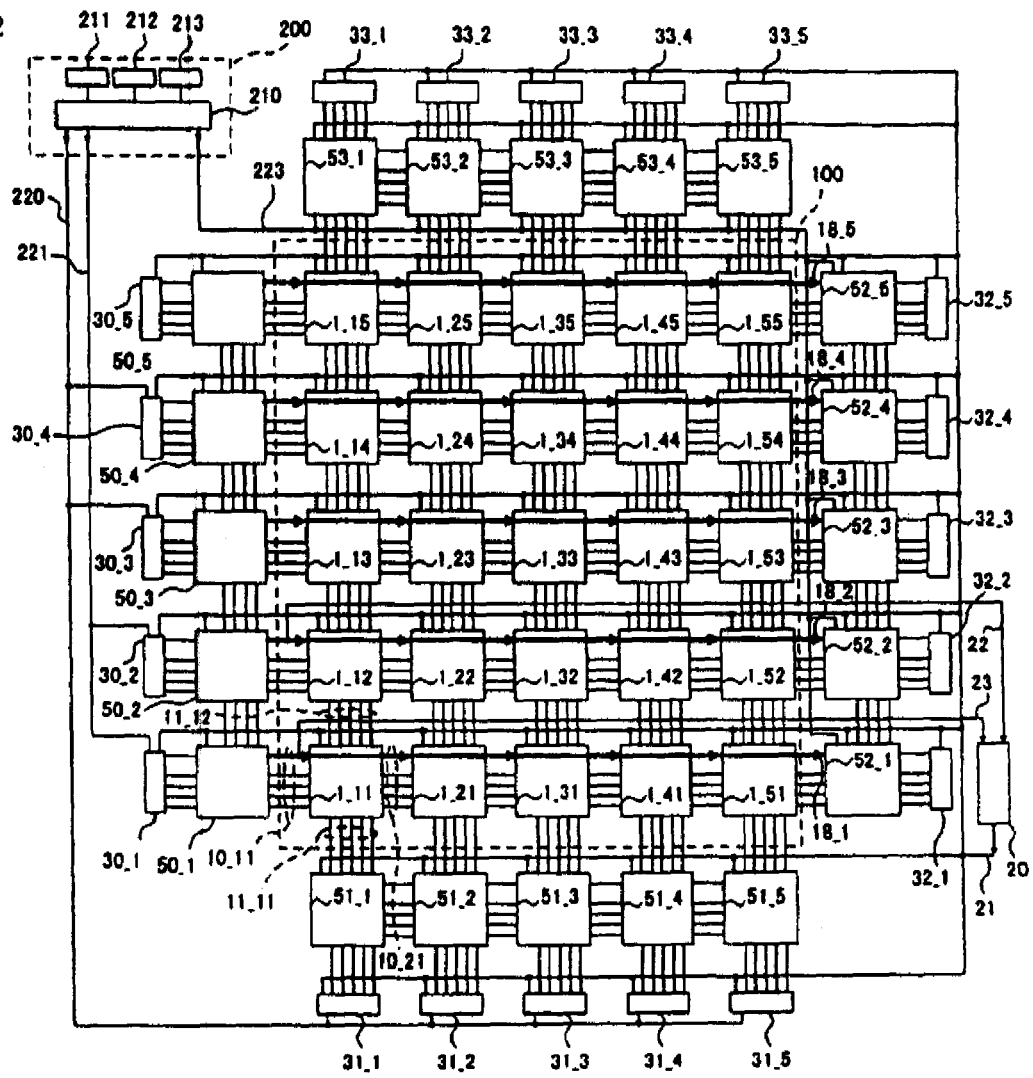
FIG. 12 is a diagram showing a transfer configuration in the first embodiment of the present invention.

Next, a description will be given of a transfer configuration in the first embodiment of the present invention with reference to FIG. 12. In FIG. 12, bold arrows represent signal path 18_y in the transfer configuration. In other words, logic blocks in each row are connected from left to right in series, and the output of each row is input to peripheral block 52_y. Here, y is an integer indicative of the coordinate of the block.

Figure 13:
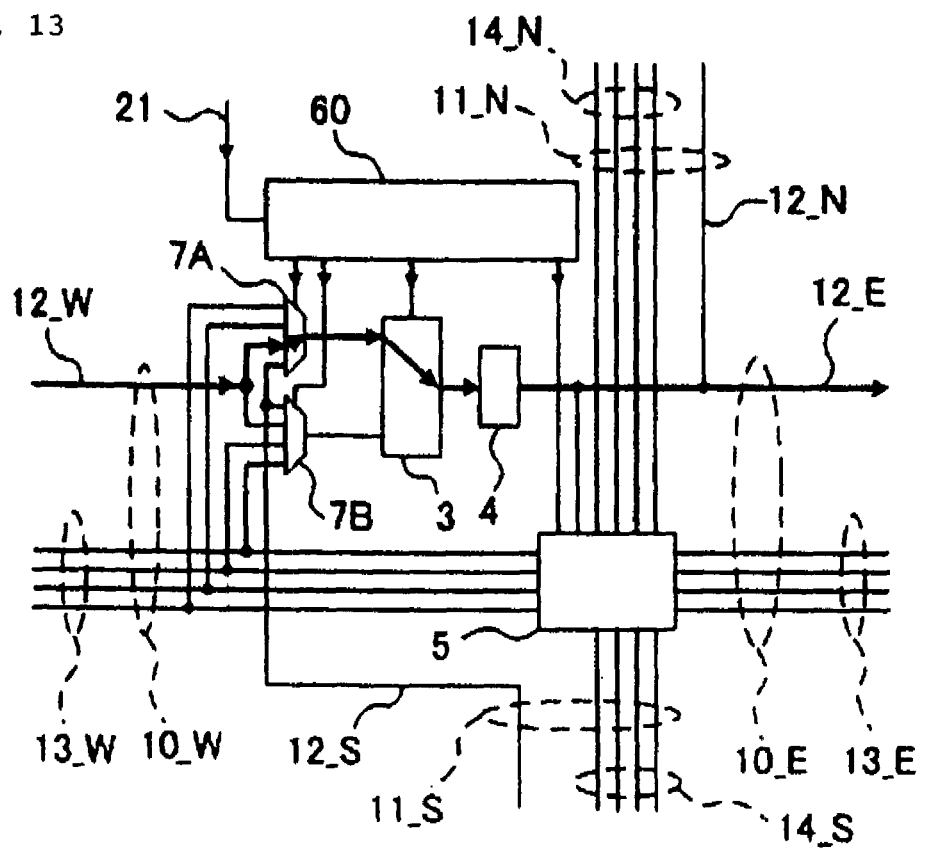
FIG. 13 is a diagram showing signal paths of logic, blocks in the transfer configuration.

Signal paths within a logic block in the transfer configuration are shown in FIG. 13. Bold arrows in FIG. 13 represent signal paths within each logic block 1. Input selector 7A is configured to output a signal on programmable wire 12_W, while functional element 3 is configured to output the output of input selector 7A as it is. Output 12_E of register 4 is connected to programmable wire 12_W of a left-hand adjacent logic block.

In FIG. 12, in the transfer configuration, registers 4 in logic blocks of each row are sequentially connected from left to right in a one-to-another connection form. Since a reconfigurable device is operated N-1 clocks in this configuration, data in register 4 within each logic block is sequentially transferred to a left-hand adjacent block, so that the peripheral block is applied with all data. Here, N is the number of logic blocks per one row of the logic block array.

Figure 14:
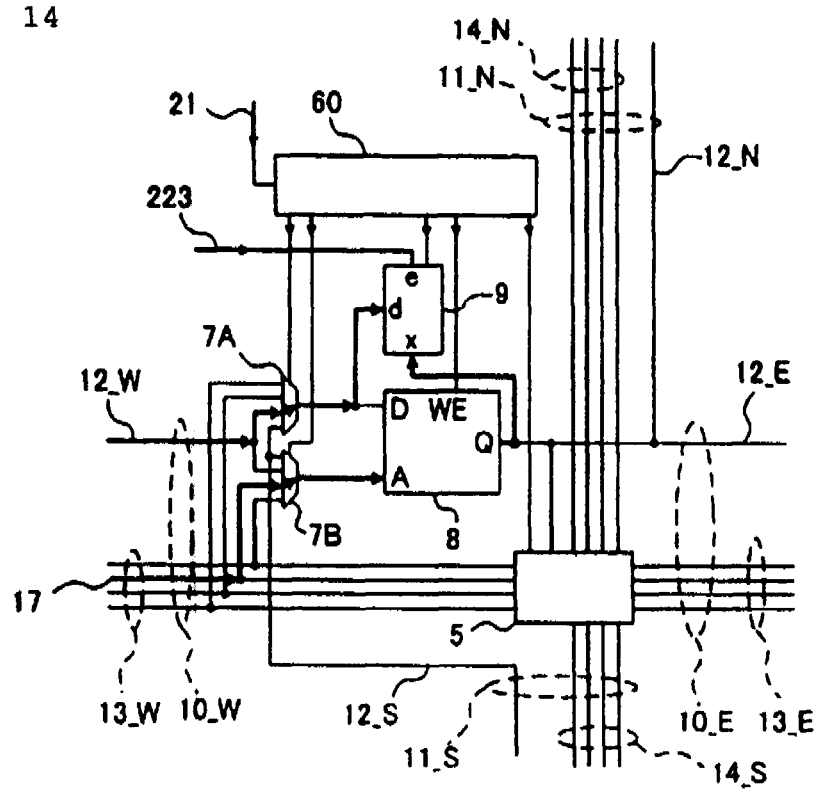
FIG. 14 is a diagram showing signal paths of peripheral blocks in the transfer configuration.

Peripheral block 52_y in FIG. 6 or 12 is shown in FIG. 14. Peripheral block 52 comprises comparator 9 added to peripheral block 50 in FIG. 10. Comparator 9 compares data input d with expected value x to accumulate this comparison result in an internal register. Whether the comparison processing is performed or not is controlled by comparison enable signal 223 output from test controller 200 in FIG. 12.

Bold arrows in FIG. 14 represent a signal path in the transfer configuration. Peripheral block 52_y is configured to cause input selector 7A to output a signal on programmable wire 12_W, so that the output signal of input selector 7A becomes data input d for comparison 9. Also, Peripheral block 52_y is configured to cause input selector 7B to output signal 17 on programmable wire 13_W, so that data memory 8 is addressed by signal 17. Further, a data memory is configured in a read mode.

An expected value is held in data memory 8 of peripheral block 52, and its output Q is used as expected value x of comparator 9. Signal 17 is test data address 220 output from test controller 200 in FIG. 12, and is distributed to peripheral block 52 through input/output block 30, peripheral block 50 and programmable wires.

Figure 15:
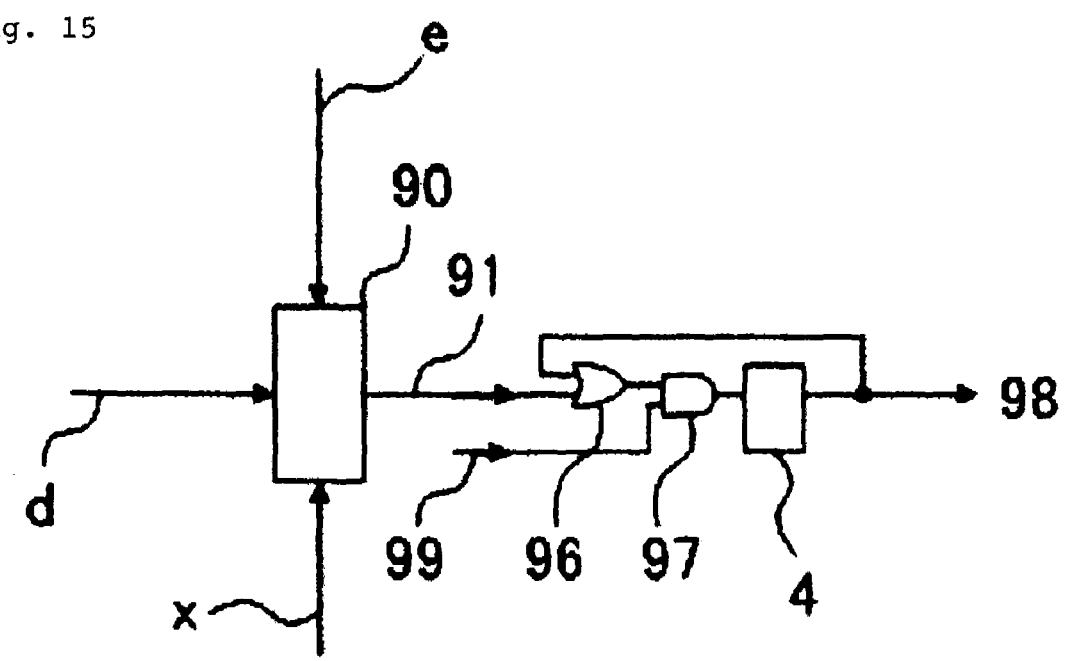
FIG. 15 is a diagram showing a comparator in FIG. 14.

An example of comparator 9 in FIG. 14 is shown in FIG. 15. This comprises expected value comparator 90, register 4, and logic gates 96, 97 associated with register 4. Expected value comparator 90 sets output 98 to logical one when the comparison enable is logical one and expected value x is not the same as data input d. Otherwise, output 98 is set to logical zero.

A circuit comprised of logical OR gate 96, logical AND gate 97, and register 4 operates in the following manner. First, reset 99 is set to logical zero for a fixed period at the start of a test, and logical zero is preserved in register 4 (in other words, register 4 is reset). Next, a reset signal is set to logical one to release the reset. After releasing the reset, logical zero is held in register 4 while output 91 of expected value comparator 90 is at logical zero. When output 91 changes to logical one, the contents of register 4 change to logical one, and afterward, register 4 continues to hold logical one irrespective of the logical value of output 91 until it is reset again. In this regard, the contents of register 4 are updated in synchronization with a clock (not shown in the figure), Owing to the operational characteristics described above, the contents of register 4 remain to be logical zero as long as a discrepancy does not occur between data input d and expected value x after releasing the reset, and if the discrepancy occurs even once, the contents of register 4 change to logical one. Thus, when the contents of register 4 are read after all tests have been completed, it can be seen whether or not a fault is detected. In this regard, output line 98 for reading the contents of register 4 is not shown in FIG. 12 (or FIG. 6). The reconfigurable device separately comprises means for reading configuration data, so that this means can be used to read the contents of the register 4.

Figure 16:
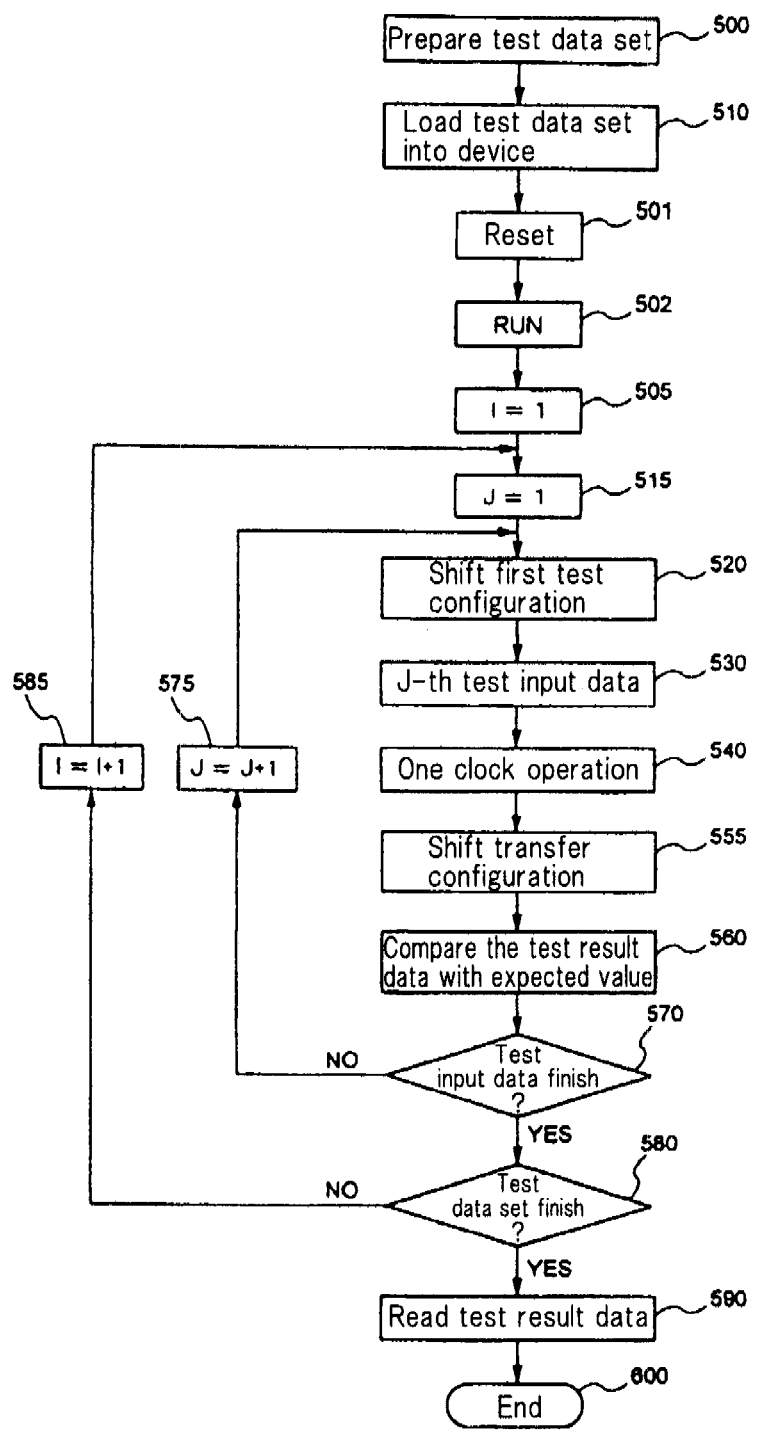
FIG. 16 is a flow chart of a test scheme in the first embodiment of the present invention.

FIG. 16 shows a flow chart of a test scheme in the embodiment of the present invention. At first step 500, one or more items of test configuration data, test input data corresponding to each test configuration, one item of transfer configuration data, and expected value data corresponding to the test input data are prepared. They are referred to as a test data set.

Next, the test data set is loaded into the reconfigurable device (FIG. 6) (step 510). Among the test data set, the configuration data is stored in the configuration memory of the programmable block, the test input data is stored in the data memory of peripheral block 50 (FIG. 6), and the expected value data is stored in the data memory of peripheral block 52 (FIG. 6), respectively.

Next, after the reconfigurable device is reset (step 501), the device is applied with instruction RUN for starting the operation (step 502). Assume that the contents of the configuration memory and data memory are held, if the device is reset.

The execution of steps 501, 502 causes the configuration controller (20 in FIG. 6) to output the address for a first test configuration, resulting in the device being set into the first test configuration (steps 505, 520). Simultaneously, first test input data for the first test configuration is output from the peripheral block (50 in FIG. 6) (steps 515, 530).

Next, the device is operated by one clock (step 540). By doing so, the result of processing the first test input data by the functional element of the logic block, i.e., test result data, enters the register of the logic block. Next, the configuration controller (20 in FIG. 6) outputs the address for a transfer configuration (21 in FIG. 6), causing the device to change to the transfer configuration while the register keeps its contents (step 555).

Next, the device is operated N-1 clocks to sequentially input the test result data within the registers of all logic blocks to the peripheral block (52 in FIG. 12). Within the peripheral block (52 in FIG. 12), the test result data are sequentially compared with the expected value, and the comparison result is accumulated in the register within the comparator (step 560).

Next, the configuration controller (20 in FIG. 6) outputs the address for the first test configuration (21 in FIG. 6), causing the device to change to the first configuration (step 520). Simultaneously, second test input data for the first test configuration is output from peripheral block (50 in FIG. 6) (steps 575, 530).

Subsequently, step 520 through step 575 are repeated until all test input data for the first test configuration are exhausted (decision 570). Next, the configuration controller (20 in FIG. 6) outputs the address for a second test configuration (21 in FIG. 6), causing the device to change to the second test configuration (steps 585, 520). Simultaneously, first test input data for the second test configuration is output from the peripheral block (50 in FIG. 6) (steps 515, 530).

Subsequently, step 515 through step 585 are repeated until all test configurations are exhausted (decision 580). Finally, the test result held in the register internal to the comparator of the peripheral block (52 in FIG. 12) is read to check whether or not a fault is detected (step 590).

Figure 17:
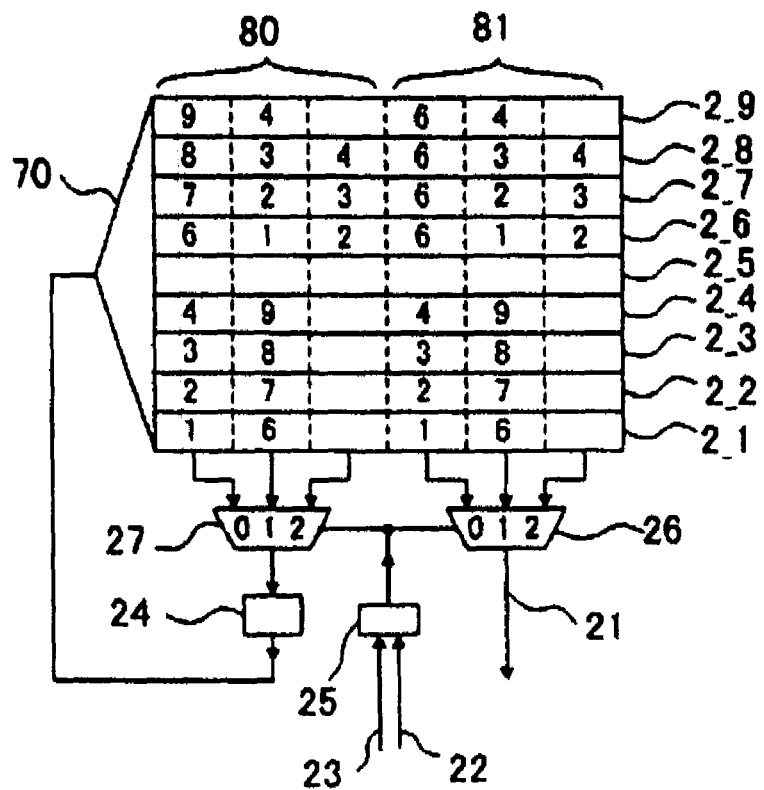
FIG. 17 is a diagram showing a configuration controller in FIG. 6.

An example of configuration controller 20 in FIG. 6 (or FIG. 12) is shown in FIG. 17. Configuration controller 20 comprises a memory having a plurality of word data 2_1-2_9, address decoder 70 for selecting any one item of word data in accordance with an address, configuration address selector 26, transition address selector 27, transition address generation block 24, and transition signal generation block 25. While FIG. 17 illustrates the case where there are nine items of word data, the number of items of word data may be an arbitrary number larger than one.

Each item of word data has transition address section 80 and configuration address section 81, where transition address section 80 includes a plurality of transition addresses (three transition addresses delimited by dotted lines in FIG. 17), and configuration address section 81 includes a plurality of configuration addresses (three configuration addresses delimited by dotted lines in FIG. 17).

Configuration address selector 26 selects one from a plurality of configuration addresses as output 21 based on the output of transition signal generation block 25. Output 21 is configuration address 21 of the reconfigurable device (FIG. 6). Transition address selector 27 selects one of a plurality of transition addresses based on the output of transition signal generation block 25, for inputting it to transition address generation block 24. Transition address generation block 24 outputs an input transition address in synchronization with the clock. Also, transition address generation block 24 outputs a particular initial address at the time of reset. The output of transition address generation block 24 becomes an input to address decoder 70 and is used to select any one item of word data 2_1-2_9.

Transition signal generation block 25 outputs signals for selecting any one of a plurality of transition addresses and any one of a plurality of configuration addresses based on transition triggers 22, 23. When transition triggers 22, 23 are both at logical zero, both address selectors 26, 27 output a zero-th input; when transition triggers 22, 23 are at logical zero and one, respectively, both address selectors 26, 27 output a first input; and when transition triggers 22, 23 are at logical one and zero, respectively, both address selectors 26, 27 output a second input. Word data 2_1-2_9 are loaded into the reconfigurable device as part of configuration data.

As shown in the flow chart of FIG. 16, the test scheme of the present invention repeats a configuration transition at step 520 and step 555. This configuration transition allows configuration controller 20 in FIG. 17 to generate a configuration address series.

Next, a description will be given of the operation of configuration controller 20 when the test scheme of the present invention is executed. A number written in each word data in FIG. 17 is an example of memory contents when the test scheme of the present invention is executed. After resetting, both transition triggers 22, 23 are both at logical zero, causing both address selectors 26, 27 to select the zero-th inputs, i.e., address value "1" written in word data 2_1. Thus, word data 2_1 is addressed, and configuration address 21 addresses the first configuration. Here, the first configuration is one item of test configuration.

Next, transition triggers 22, 23 change to logical zero, one, respectively, at step 555 in FIG. 16, causing both address selectors 26, 27 to select the first inputs, i.e., address value "6" written in data word 2_1. Thus, configuration address 21 addresses a sixth configuration. Assume herein that the sixth configuration is a transfer configuration.

Transition address value "6" is output from transition address generation block 24 in FIG. 17 to address word data 2_6 at the next clock. At step 560 in FIG. 16, the sixth configuration remains for N clocks until comparison of the test result data with the expected value is completed. In the meantime, transition triggers 22, 23 in FIG. 17 are both at logical zero, causing both address selectors 26, 27 to select the zero-th inputs, i.e., address value "6" written in word data 2_6. Thus, word data 2_6 is continuously addressed, so that configuration address value "6" is continuously output.

After comparison with the expected value, transition triggers 22, 23 change to logical zero, one, respectively, causing both address selectors 26, 27 to select the first inputs, i.e., address value "1" written in word data 2_6. Thus, configuration address 21 addresses the first configuration. At the next clock, transition address value "1" is output from transition signal generation block 24 to address word data 2_1. This corresponds to returning to step 520 through steps 570, 575 in FIG. 16. Subsequently, word data 2_1 and 2_6 in FIG. 17 are alternately addressed to alternately transition to the first and sixth configurations in a similar manner.

At step 570 in FIG. 16, word data 2_6 in FIG. 17 is addressed, but when the determination result of the condition at step 570 is YES, transition triggers 22, 23 change to logical one, zero, respectively, causing both address selectors 26, 27 to select the second inputs, i.e., address value "2" written in word data 2_6. Thus, configuration address 21 addresses the second configuration. The second configuration is the second test configuration. Operations up to here are referred to as a first process.

At the next clock, transition address value "2" is output from transition signal generation block 245 in FIG. 17 to address word data 2_2. This corresponds to returning to step 520 through steps 580, 585, 515 in FIG. 16. Subsequently, word data 2_1 and 2_6 in the first process correspond to word data 2_2 and 2_7, respectively, and operations are repeated in a manner similar to the first process. This is referred to as a second process. Subsequently, a similar process is performed until the determination result of the condition at step 580 changes to YES in FIG. 16.

In FIG. 17, word data 2_i corresponds to an i-th test configuration, while word data 2_(i+5) corresponds to a transfer configuration used in an i-th test configuration (i=1, 2, 3, 4). However, the transfer configuration is the sixth configuration alone, so that a plurality of test configurations share the same transfer configuration. For this reason, configuration address sections 81 of word data 2_6, 2_7, 2_8, 2_9 that is further most to the left, corresponding to the transfer configuration (i.e., data corresponding to the zero-th input of configuration address selector 26), are all "6."

As is apparent from the foregoing description, the test operation is controlled by providing transition triggers 22, 23 in FIG. 17 or 6 in an appropriate time series. Transition triggers 22, 23 are given from peripheral blocks 50_2, 50_1, for example, as shown in FIG. 6. More specifically, they are provided in output 12_E of data memory 8 in peripheral block 50 (FIG. 10). Address A of this data memory 8 is given by transition trigger address 221 generated by test controller 200 in FIG. 6. Accordingly, when transition trigger data are preserved in an appropriate order in data memories 8 within peripheral blocks 50_2, 50_1, an appropriate time series of transition triggers is generated by a time series of transition trigger addresses output by the test controller.

As shown in FIG. 6, test controller 200 comprises test data counter 211, test configuration counter 212, comparison period counter 213, and test control logic 210. In the test scheme of the present invention, a plurality of test input data are provided for each test configuration. This corresponds to the process in which steps 520 through 575 in FIG. 16 are repeated the same number of times that is the number of pieces of test input data. Test data counter 211 in FIG. 6 is used to count this number of times. Based on the value of this counter, test data address 220 is generated.

Also, as previously described, at step 560 in FIG. 16, the test result data is compared with the expected value over N clocks. In order to perform the comparison with the expected value only during this period, a comparator (FIG. 14) within peripheral block 52 in FIG. 6 is applied with a signal for turning compare enable on during this period. Comparison period counter 213 within test controller 200 in FIG. 6 is provided to count the period in which comparison enable is turned on. Comparison enable signal 223 is generated based on the value of the comparison period counter 213. Transition trigger address 221 in turn is generated based on the values of test data counter 211 and comparison period counter 213.

The test scheme of the present invention assumes that a plurality of test configurations are generally used. This corresponds to the process in which steps 515 through 585 in FIG. 16 are repeated the number of times that is the number of test configurations. Test configuration counter 212 in FIG. 6 is used to count this number of times. In this way, test controller 200 comprises a plurality of counters, but it is test control logic 210 that controls them, and generates output signals 220, 221, 223 from the values of the counters.

According to the first exemplary embodiment of the present invention, a test can be made in which the number of times that the configuration data is loaded is significantly fewer as compared with before. This is because the configuration memory holds one transfer configuration data and one or more test configuration data to switch and use them as appropriate. In the conventional test scheme, test configuration data and transfer configuration data must be alternately loaded into a device. In contrast, the test scheme of the present invention is very efficient because it can repeatedly use once loaded configuration data that have already been loaded again and again, and need not reload the data many times as before.

Further, in the test scheme of the present invention, test input data, expected value data, and transition trigger data are held in data memory disposed around the reconfigurable device and used, and the expected value comparator is provided in the peripheral block, so that a large number of tests can be made without communicating data to/from the outside of the device. Since a large delay is involved in communication to/from the outside of the device through a test bus, tests can be made only at low speeds. On the other hand, in the test scheme of the present invention, once configuration data is loaded, tests can be performed afterward based only on movements of data within the device, so that high-speed test can be made without being limited by the speed of the test bus. This also makes a so-called At-Speed test possible and contributes to a reduction in test time.

Further, since the first embodiment of the present invention is configured to accumulate the result of a comparison with an expected value and read only results finally left in the registers, the amount of read data is largely reduced, and the test time is also reduced in this respect.

The reconfigurable device employs many switches such as input selectors (7A, 7B in FIG. 7) in the logic block, a programmable switch (5 in FIG. 7), and the like. In testing a switch, what is examined is whether an input propagates to an output, as it is, when the switch is made conductive. In this event, test input data is the same as the expected value for any switch. In other words, the same test input data and expected value can be used again and again for tests of a large number of switches. The test scheme of the present invention is suitable for such tests.

In the conventional test scheme, even the same test input data must be repeatedly input from the outside, and the same test result data must be repeatedly read out. In the test scheme of the present invention, once test input data and expected value are written into the data memory, they can be used again and again any number of times during the execution of the test, so that data communications between the device and the outside can be largely reduced.

As described above, according to the test scheme of the present invention, data communications between the device and the outside can be largely reduced to reduce the test time, as compared with before. Further, it is suitable for the At-Speed test.

Figure 18:
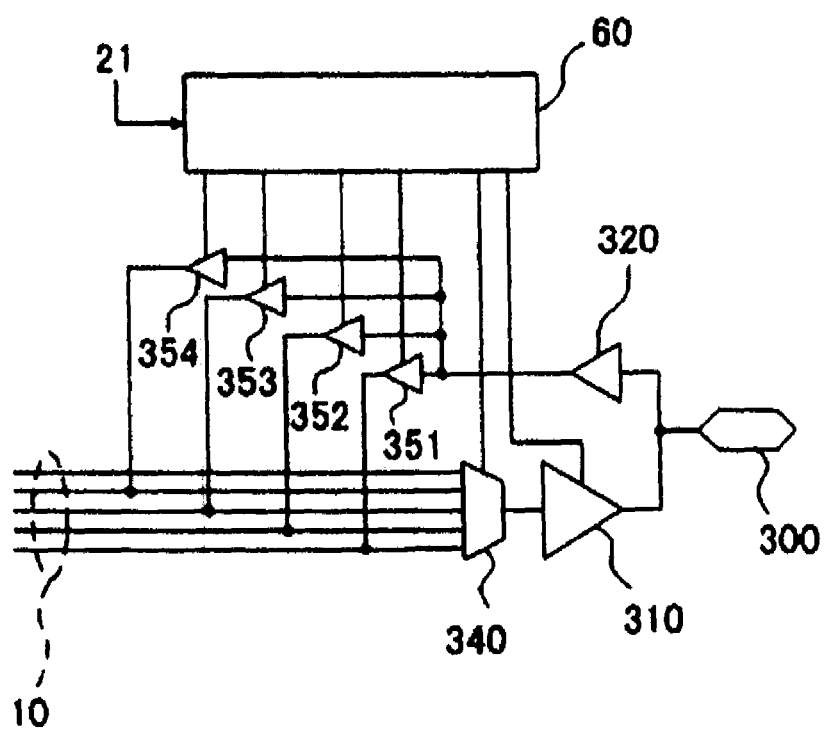
FIG. 18 is a diagram showing another example of input/output blocks.

While FIGS. 6 and 12 illustrate paths on which signals flow from left to right, the present invention is not so limited. For example, in the reconfigurable devices in FIGS. 6 and 12, when input/output block 31_x has the same structure as FIG. 9; when peripheral block 51_x has the same structure as FIG. 10; and when peripheral block 53_x has the same structure as FIG. 14, respectively, a configuration in which a signal flows from below to above of the device can be used for a test. In this regard, input/output block 33_x has the same as input/output block 32_y, and has a structure, for example, as shown in FIG. 18. In FIG. 18, parts equivalent to those in FIG. 9 are indicated by the same reference numerals.

Figure 19:
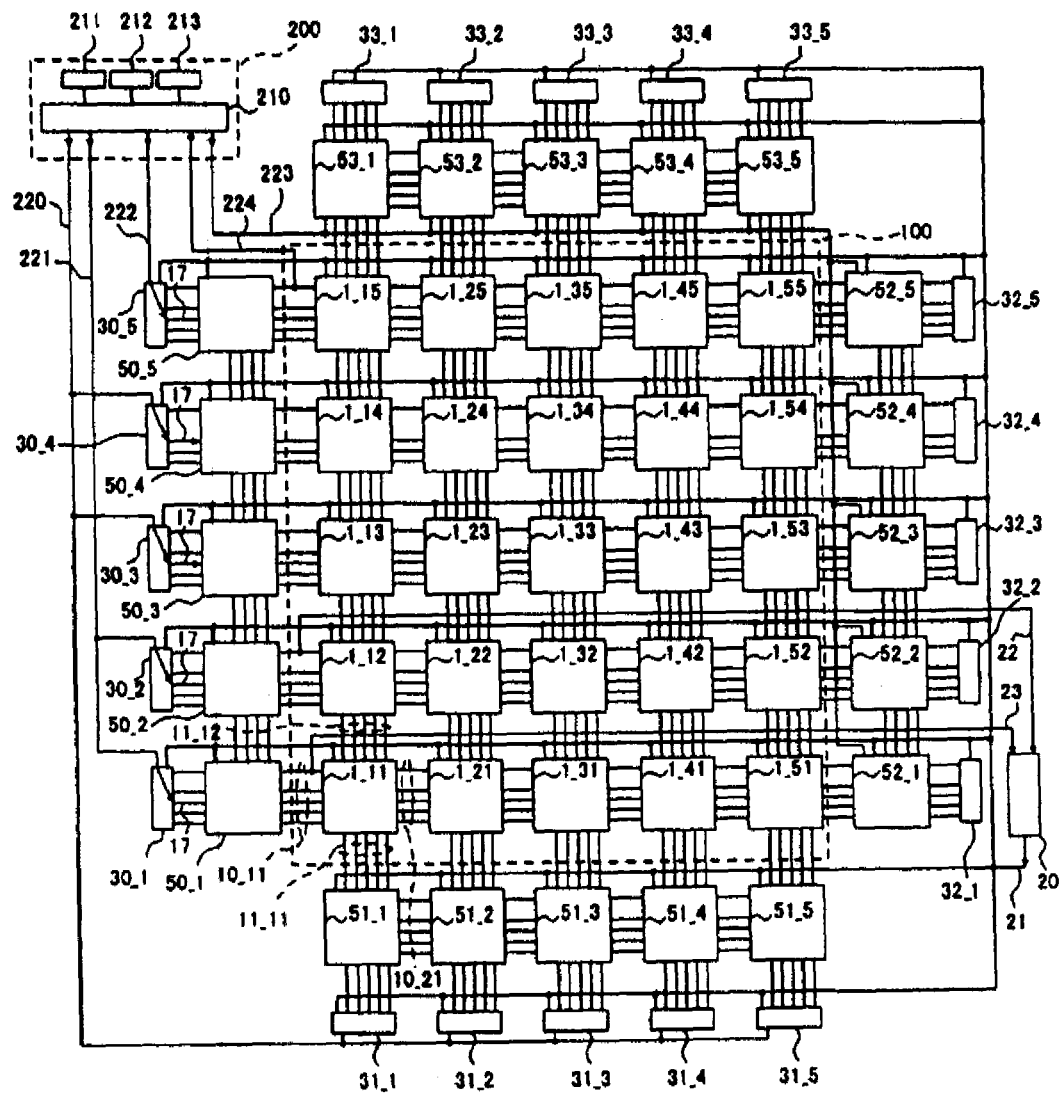
FIG. 19 is a diagram showing a second embodiment of the present invention.

Next, a description will be given of a second exemplary embodiment of the present invention. In the second embodiment of the present invention (FIG. 19), in addition to the reconfigurable device of the first embodiment (FIG. 6) of the present invention, test controller 200 outputs test parameter address 222, test parameter address 222 addresses a data memory in peripheral block 50_5 through input/output block 30_5, and output 224 of the data memory in peripheral block 50_5 is input to test controller 200.

The data memory in peripheral block 50_5 preserves a variety of parameters for use in performing tests. For example, the number of pieces of test input data may generally differ from one test configuration to another. When the number of pieces of test input data per test configuration are previously held in the data memory of peripheral block 50_5, and when a variety of outputs 220, 221, 223 of test controller 200 are optimally generated based on the data, wasteful number of clock cycles can be reduced to reduce the test time. When this function is not provided, the number of repetitions from step 520 through 575 in FIG. 16 must be matched with the largest number of test input data, causing a need for additional processing for that purpose.

Otherwise, a wide variety of test processing can be generally performed by holding a variety of test parameters required to perform more complicated test processing in the data memory of the peripheral block, and determining the operation of the test controller based on their contents.

In the first and second embodiments of the present invention, the data memory in the peripheral block is an application circuit implemented on the reconfigurable device which can be used to hold data in a normal operation. By using the data memory in the test operation as well, no memory has to be provided separately for the test operation.

Figure 20:
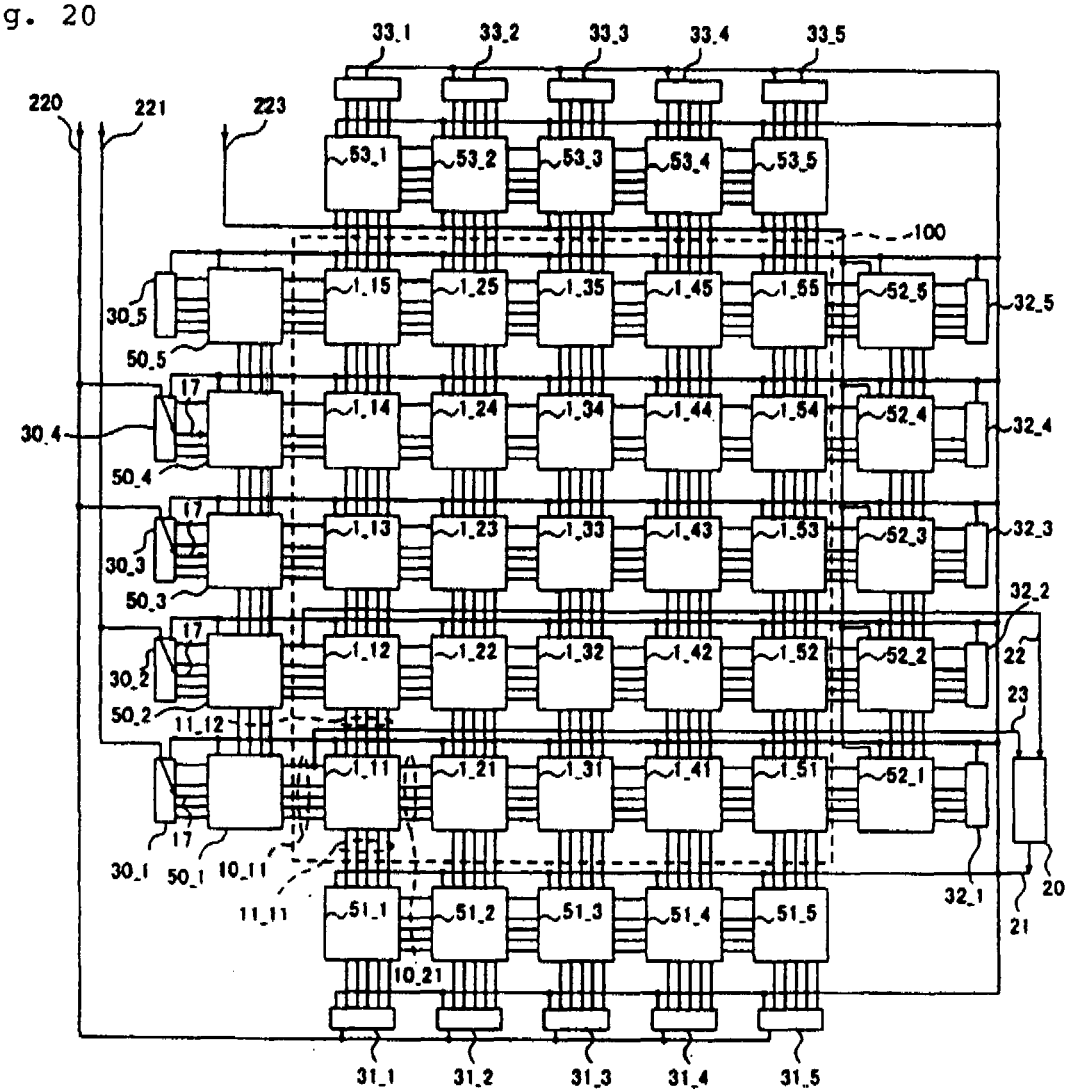
FIG. 20 is a diagram showing a third embodiment of the present invention.

Next, a description will be given of a third exemplary embodiment of the present invention. The third embodiment (FIG. 20) of the present invention omits test controller 200 in the reconfigurable device of the first embodiment (FIG. 6) of the present invention. Signals 220, 221, 223 required for test processing are supplied from the outside of the device. In this way, since arbitrary signals can be applied from the outside of the device, a wider variety of tests can be made, as compared with the first and second embodiments of the present invention.

Also, since the test controller is not present, the area made available by a region on which the test controller is formed when the reconfigurable device is formed on a substrate, thus improving the freedom to use the area occupied by each part. Since a test is performed while signals are input from the outside of the device using a path which causes a large delay, the clock frequency is lower as compared with the first and second embodiments of the present invention. However, the third embodiment is the same as the first and second embodiments of the present invention in that it is a test scheme repeatedly uses configurations that have already been read, and therefore, the configuration load time can be largely reduced as compared with the conventional example.

Figure 21:
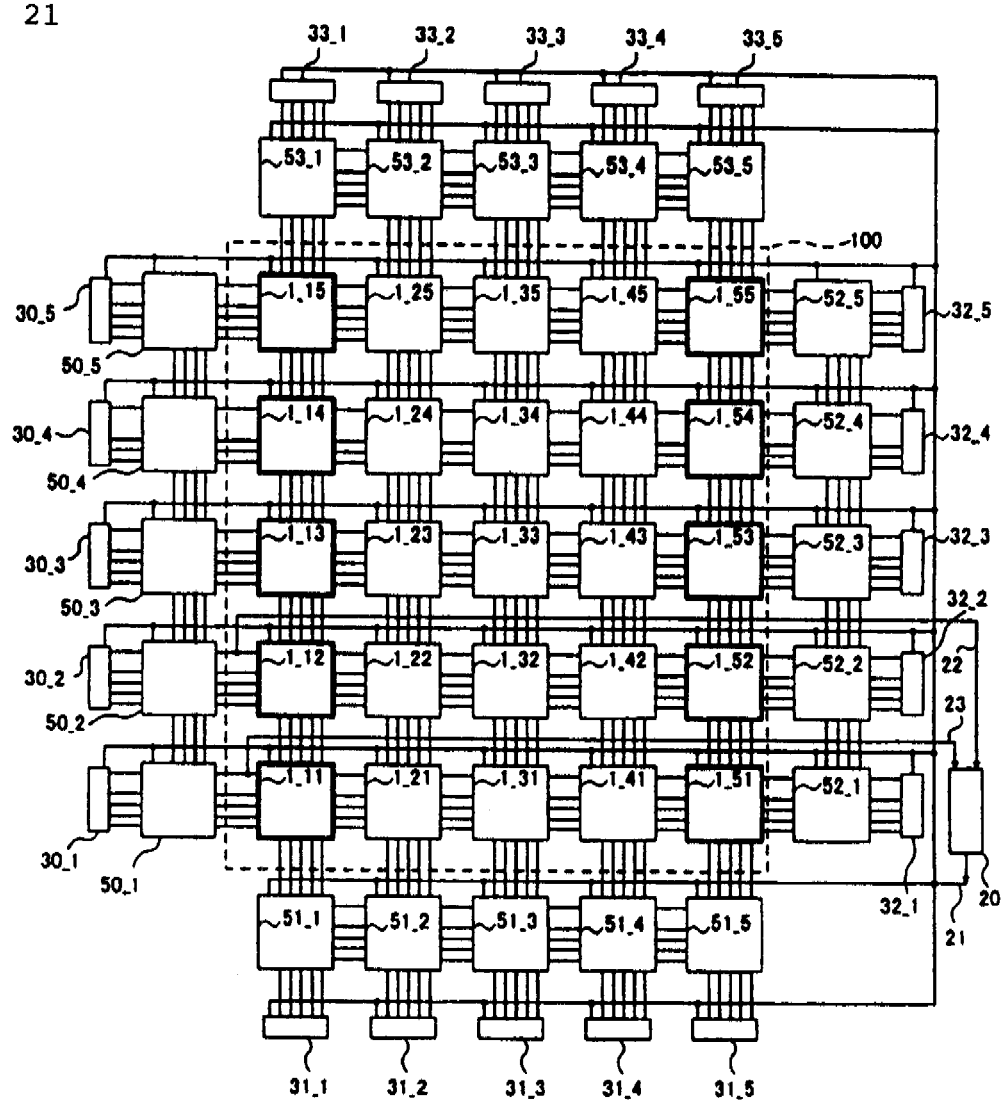
FIG. 21 is a diagram showing a fourth embodiment of the present invention.

Next, a description will be given of a fourth exemplary embodiment of the present invention. The fourth embodiment (FIG. 21) of the present invention omits the comparator and test controller 200 within peripheral block 52 in the reconfigurable device of the first embodiment (FIG. 6) of the present invention, and implements their functions by logic blocks (bold frames in FIG. 21). For example, the test controller is implemented by logic blocks 1_11, 1_12, 1_13, 1_14, 1_15 in FIG. 21, while the comparator is implemented by logic blocks 1_51, 1_52, 1_53, 1_54, 1_55.

In the fourth embodiment of the present invention, signals corresponding to outputs 220, 221, 223 from test controller 200 in FIG. 6 are distributed using programmable wires. In this way, a test only circuit need not be embedded in the device. Advantageously, since the test function is implemented by logic blocks, the test function can be modified after the device is manufactured. Also, the area can be saved because a test only circuit is not required.

It should be noted that a separate test is made for the logic blocks used to implement the test logic and comparator. Here, while a description has been given of an example in which all functions of the test controller and comparator are implemented by the logic blocks, those skilled in the art could readily contemplate an exemplary modification in which only part of these functions is implemented by logic blocks, while the rest is implemented by dedicated circuits.

While a description has been given of a reconfigurable device of a particular structure in order to describe embodiments of the present invention, the present invention is not limited to the structure used in the description. For example, the number and configuration of the programmable wires, the number of input selectors and the number of inputs thereof, the presence or absence of register bypass path, the arrangement of the data memory used in tests, and the like can be readily modified by those skilled in the art.

The invention claimed is:

1. A system for testing a reconfigurable device including a plurality of programmable blocks, and programmable wires for programmably making a connection between these programmable blocks, wherein:

each of said programmable blocks comprises a configuration memory which previously stores a plurality of test configuration data and transfer configuration data, and a register;

said reconfigurable device includes a data memory which previously and simultaneously stores, prior to carrying out a test, a plurality of test input data for each of the plurality of test configuration data, and holds data in a normal operation; and said system, in a test configuration, addresses a selected test configuration data from among the plurality of test configuration data in said configuration memory to set said programmable blocks in the test configuration state so as to carry out the test of said reconfigurable device in which each of the plurality of test data, which correspond to the selected test configuration data, is input to the plurality of programmable blocks, and holds the test results in said registers, and in a transfer configuration, addresses the transfer configuration data in said configuration memory to connect said registers in series so as to sequentially read the test results, and alternately executes the test configuration state and the transfer configuration state a number of times equal to the number of pieces of test input data for each of the plurality of test configuration data.

2. The test system according to claim 1, wherein said reconfigurable device comprises:
a first address generating unit which generates an address of said configuration memory based on state transition trigger data.

3. The test system according to claim 2, wherein said reconfigurable device comprises:
a second address generating unit which generates an address of the data memory,
wherein the data memory stores the state transition trigger data and the plurality of test data.

4. The test system according to claim 3, wherein an address generation operation of the second address generating unit is controlled by a test parameter, and said test parameter is held in said data memory.

5. The test system according to claim 2, wherein said reconfigurable device comprises the data memory stores the state transition trigger data and the plurality of test data, where an address of the data memory is supplied from an outside.

6. The test system according to claim 1, wherein said reconfigurable device further includes a comparing unit which compares the test result with an expected value and for accumulating the comparison result.

7. The test system according to claim 6, wherein said comparing unit is implemented by configuring said programmable blocks.

8. The test system according to claim 1, wherein at least part of the test system is implemented by configuring said programmable blocks.

9. A method of testing a reconfigurable device including a plurality of programmable blocks, and programmable wires for programmably making a connection between these programmable blocks, wherein:
each of said programmable blocks is provided with a configuration memory which previously stores a plurality of test configuration data and transfer configuration data, and a register, received
said method comprising:
previously and simultaneously storing in a data memory of the reconfigurable device, prior to carrying out a test, a plurality of test input data for each of the plurality of test configuration data;
in a test configuration, addressing a selected test configuration data from among the plurality of test configuration data in said configuration memories to set said programmable blocks in the test configuration state to make the test of said reconfigurable device in which each of the plurality of test data, which corresponds to the selected test configuration data, is input to the plurality of programmable blocks, and holding the test results in said registers;
in a transfer configuration, addressing the transfer configuration data in said memory to connect said registers in series so as to sequentially read the test results; and
alternately executing the test configuration state and the transfer configuration state a number of times equal to the number of pieces of test input data for each of the plurality of test configuration data.

10. The test method according to claim 9, wherein the alternately executing the test configuration state and the transfer configuration state includes an operation in which an address of said configuration memory is generated based on state transition trigger data to make a state transition.

11. The test method according to claim 9, further comprising: comparing the test result with an expected value and accumulating this comparison result.

12. A reconfigurable device including a plurality of programmable blocks, and programmable wires for making a connection between these programmable blocks, wherein:
each of said programmable blocks comprises a configuration memory which previously stores a plurality of test configuration data and transfer configuration data, and a register; and
said reconfigurable device includes a data memory which previously and simultaneously stores, prior to carrying out a test, a plurality of test input data for each of the plurality of test configuration data, and said reconfigurable device, in a test configuration, addresses a selected test configuration data from among the plurality of test configuration data in said configuration memory to set said programmable blocks in the test configuration state so as to carry out the test of said reconfigurable device in which each of the plurality of test data, which correspond to the selected test configuration data, is input to the plurality of programmable blocks, and holds the test results in said registers, and in a transfer configuration, addresses the transfer configuration data in said configuration memory to connect said registers in series so as to sequentially read the test results and alternately executes the test configuration state and the transfer configuration state a number of times equal to the number of pieces of test input data for each of the plurality of test configuration data.

13. The reconfigurable device according to claim 12, further comprising:
a first address generating unit which generates an address of said configuration memory based on state transition trigger data.

14. The reconfigurable device according to claim 13, further comprising: a second address generating unit which generates an address of the data memory, wherein the data memory stores the state transition trigger data and the plurality of test data.

15. The reconfigurable device according to claim 14, wherein an address generation operation of said second address generating unit is controlled by a test parameter, and said test parameter is held in said data memory.

16. The reconfigurable device according to claim 13, wherein the data memory stores the state transition trigger data and the plurality of test data, where an address of the data memory is supplied from an outside.

17. The reconfigurable device according to claim 12, further comprising: a comparing unit which compares the test result with an expected value and accumulating the comparison result.

18. The reconfigurable device according to claim 17, wherein said comparing unit is implemented by configuring said programmable blocks.

19. The reconfigurable device according to claim 12, wherein at least part of the reconfigurable device s is implemented by configuring said programmable blocks.

* * * * *